(12) United States Patent
Dunipace

(10) Patent No.: US 8,946,881 B2
(45) Date of Patent: Feb. 3, 2015

(54) HIGH-VOLTAGE PACKAGED DEVICE

(75) Inventor: Richard A. Dunipace, Highland Village, TX (US)

(73) Assignee: Fairchild Semiconductor Corporation, San Jose, CA (US)

( * ) Notice: Subject to any disclaimer, the term of this patent is extended or adjusted under 35 U.S.C. 154(b) by 671 days.

(21) Appl. No.: 12/944,192

(22) Filed: Nov. 11, 2010

(65) Prior Publication Data

US 2012/0032319 A1 Feb. 9, 2012

Related U.S. Application Data

(60) Provisional application No. 61/370,477, filed on Aug. 4, 2010.

(51) Int. Cl.
*H01L 29/72* (2006.01)
*H01L 23/495* (2006.01)
*H01L 23/00* (2006.01)

(52) U.S. Cl.
CPC .......... *H01L 23/49562* (2013.01); *H01L 24/97* (2013.01); *H01L 2224/48091* (2013.01); *H01L 2224/48247* (2013.01); *H01L 2224/48472* (2013.01); *H01L 24/48* (2013.01); *H01L 2924/13091* (2013.01); *H01L 2224/32245* (2013.01); *H01L 2224/73265* (2013.01)
USPC .......................................... 257/690; 257/675

(58) Field of Classification Search
USPC ................................................. 257/675, 690
See application file for complete search history.

(56) References Cited

U.S. PATENT DOCUMENTS 7,790,616 B2 * 9/2010 Buchoff et al. ................ 438/682
2007/0267728 A1 * 11/2007 Noquil et al. ................. 257/675

* cited by examiner

*Primary Examiner* — Edward Wojciechowicz
(74) *Attorney, Agent, or Firm* — Kenneth E. Horton; Kirton McConkie

(57) ABSTRACT

Packaged devices and methods for making and using the same are described. The packaged devices contain one or more circuit components, such as a die, that is attached to a leadframe having a first lead, a second lead, and a third lead (although, higher lead counts may be employed in some implementations). A portion of the circuit component and the leadframe are encapsulated in a molded housing so that the first lead is exposed from a first end of the housing while the second and third leads are exposed from a second end of the housing. In some configurations, the packaged device does not contain a fourth lead that is both electrically connected to the first lead and that is exposed from the second end of the molded housing. In other configurations, an area extending from the second lead to the third lead in the molded housing comprises an insulating material having a substantially uniform conductivity. Thus, the packaged devices have relatively large creepage and clearance distances between the first lead and the second and third leads. As a result, the packaged devices are able to operate at relatively high operating voltages without experiencing voltage breakdown. Other embodiments are described.

26 Claims, 7 Drawing Sheets

HIGH-VOLTAGE PACKAGED DEVICE

CROSS-REFERENCE TO RELATED APPLICATION

This application claims priority to U.S. Provisional Application Ser. No. 61/370,477, filed Aug. 4, 2010, and entitled "HIGH-VOLTAGE D2PAK," the entire disclosure of which is hereby incorporated by reference.

FIELD

This application relates generally to packaged devices and methods for making such devices. More specifically, this application relates to high-voltage packaged devices and methods for making and using the same.

BACKGROUND

Packages containing one or more integrated circuits (IC or ICs) or other electronic components are used in a wide variety of electronic apparatus. Generally, the devices (or chips) make up a complete or partial miniaturized electronic circuit. One of the latter steps in the fabrication process forms a package that is used to protect the device from environmental hazards.

After it has been formed, the package (or packaged device) is often used in an ever growing variety of electronic applications, such as in computer devices, communication equipment, and so forth. Depending on the type of application, the package may need to be able to function at relatively high operating voltages without experiencing voltage breakdown.

SUMMARY

This application relates to packaged devices and methods for making and using the same. Generally, the packaged devices contain one or more circuit components, such as a die, that is attached to a leadframe having a first lead, a second lead, and a third lead. A portion of the circuit component and the leadframe are encapsulated in a molded housing so that the first lead is exposed from a first end of the housing while the second and third leads (and in some applications, one or more additional and/or, insolated lead(s)) are exposed from a second end of the housing. In some configurations, the packaged device does not contain a fourth lead that is both electrically connected to the first lead and that is exposed from the second end of the molded housing. In other configurations, an area extending from the second lead to the third lead in the molded housing comprises an insulating material having a substantially uniform conductivity. Thus, the packaged devices have relatively large creepage and clearance distances between the first lead and the second and third leads (and one or more additional leads that are not both electrically connected to the first lead and exposed from the package's second end, if applicable). As a result, the packaged devices are able to operate at relatively high operating voltages without experiencing voltage breakdown.

BRIEF DESCRIPTION OF THE DRAWINGS

The following description can be better understood in light of the Figures, in which.

Figure 1A:
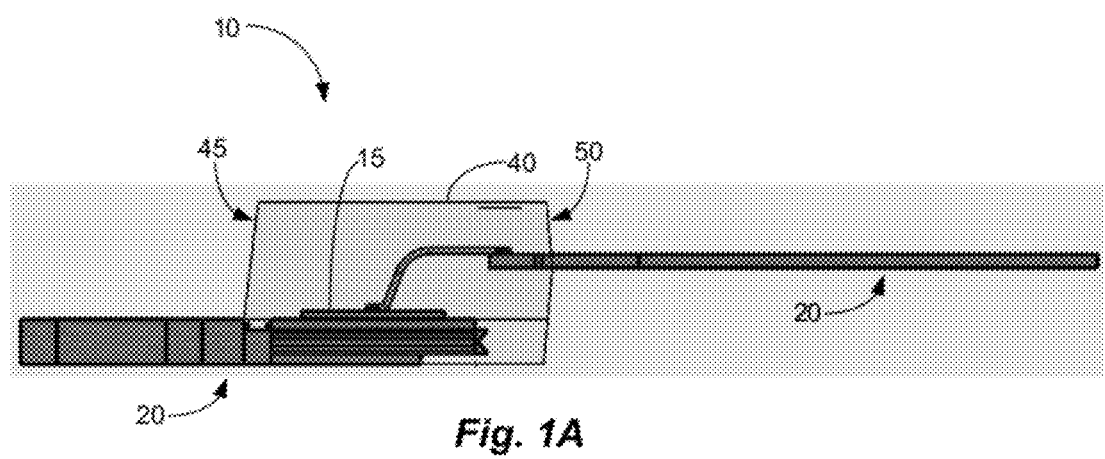
FIG. 1A shows a side view of some embodiments of a three-pin high-voltage packaged device where a molded housing is illustrated as being transparent.

The Figures illustrate specific aspects of the described high-voltage packaged devices and methods for making such devices. Together with the following description, the Figures demonstrate and explain the principles of the methods, principles, and structures produced described herein. In the drawings, the thickness of layers and regions may be exaggerated for clarity. Furthermore, it will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the described high-voltage packaged devices and associated methods of making and using the devices can be implemented and used without employing these specific details. Indeed, the packaged devices and associated methods can be placed into practice by modifying the illustrated devices and methods and can be used in conjunction with any other apparatus and techniques conventionally used in the industry. For example, while the description below focuses on methods for making and using high-voltage packaged devices used in D2PAK and DPAK devices, it could be modified for any other suitable devices, such as rectifiers, TVSs, or any other suitable electrical device in which a lead can be removed to improve isolation voltage between adjacent leads. And while the described devices are referred to as being high-voltage devices, it should be understood that they are capable of operating at lower voltages.

As mentioned, the present application discusses packaged devices that are capable of functioning at relatively high voltages without experiencing voltage breakdown due to arc'ing, induction, flashover, etc. The high-voltage packaged devices comprise a first lead that is exposed from a first end of a molded housing and a second lead and a third lead exposed from a second end of the housing. In some configurations, the described packaged devices do not include a fourth lead that is electrically coupled to the first lead and that is externally exposed from the housing's second end. For instance, while the packaged devices may have one or more additional leads (in addition to the second and third leads) that extend from the housing's second end, in such implementations, the additional leads are electrically isolated from the first lead.

By not having such a fourth lead that is both electrically coupled to the first lead and that extends from the housing's second end, the described packaged devices can have relatively long voltage creepage and voltage clearance distances between the first lead and any other package leads, allowing the devices to function at relatively high operating voltages. The term voltage creepage may refer to the shortest distance on the surface of an insulating material between two conductive elements. Also, the term voltage clearance may refer to the shortest distance through the air between two conductive elements.

Figure 1B:
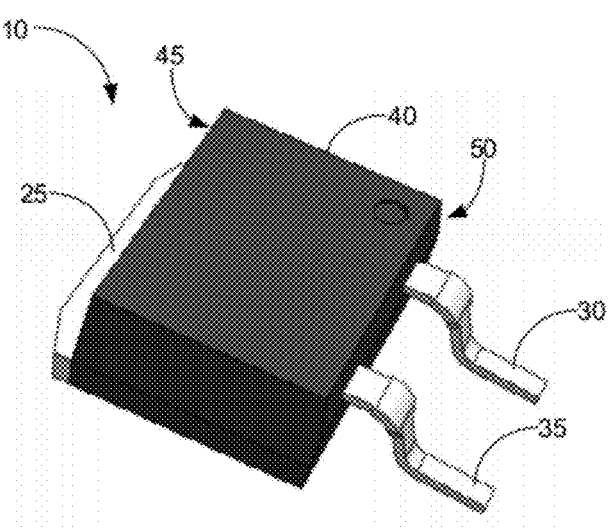
FIG. 1B shows a perspective view of some embodiments of the packaged device.

While the described high-voltage packaged devices can comprise other known components, FIG. 1A shows some embodiments in which the high-voltage packaged device (or packaged device) 10 comprises a circuit component (e.g., die 15) and a leadframe 20. And FIG. 1B shows other embodiments in which the packaged device 10 also comprises a first lead 25, a second lead 30, a third lead 35, and a molded housing 40 having a first end 45 and a second end 50.

With respect to the circuit component (e.g., die 15), the high-voltage packaged device 10 can comprise any suitable number of circuit components. Furthermore, the circuit component can comprise any suitable circuit component known in the art. In this regard, some examples of suitable circuit components include one or more dies, semis, resistors, rectifiers, diodes, TVSs, diacs, triacs, SCSs, SCRs, three-pin circuit made up of two or more devices, and/or any other suitable device. Indeed, in some embodiments, the circuit component comprises a die.

Where the circuit component comprises a semiconductor die 15, the die may be made of any suitable semiconductive material known in the art. In this regard, some examples of such semiconductive materials include silicon, gallium arsenide, silicon carbide, gallium nitride, germanium, and combinations thereof.

The die 15 can be made up of any suitable number and/or type of integrated circuit (IC) devices. In particular, some examples of such IC devices can include, without limitation, transistors (e.g., bipolar junction transistors (BJT), metal-oxide-semiconductor-field-effect transistors (MOSFET), insulated-gate-field-effect transistors (IGFET), and/or any other suitable type of transistor), logic or digital IC devices, linear regulators, audio power amplifiers, LDOs, driver ICs, diodes (e.g., zener diodes, schottky diodes, small signal diodes, etc.), memory (e.g., RAM), analog circuits, power circuits, processors, protection devices (e.g., TVSs, varistors, etc.), and/or triggering devices (e.g., triacs, diacs, SCSs, SCRs, etc.). In some embodiments, the device comprises one or more transistors or other parts selected from a MOSFET, BJT, a diac, a diode, a rectifier, a TVS, a resistor, etc.

The device(s) on the die 15 can comprise any suitable characteristic, including, without limitation, bond pads. For instance, where the die comprises a BJT, the BJT can comprise bond pads connected to its collector, base, and emitter regions (not shown). Furthermore, where the die comprises a MOSFET, the MOSFET can comprise bond pads that are connected to its drain, gate, and source regions (not shown). If the die comprises a passive electrical component, such as a resistor, in some instances, the bond pads can be connected to either end of the resistor without regard for polarization or specialization.

With respect to the leadframe 20, it may be made from any suitable leadframe material, including a buildup substrate or standard leadframe-based materials, like copper, Alloy 42, or copper alloys. Because standard leadframe base materials may be less expensive than some buildup substrates, some embodiments of the leadframe comprise standard leadframe materials.

The leadframe 20 can have any known characteristic in the art. In some embodiments, the leadframe optionally comprises a layer of metal plating (not shown). In such embodiments, the layer of metal plating may comprise NiPdAu, an adhesion sublayer, a conductive sublayer, an oxidation resistant layer, and/or any other suitable metal plating. For example, the leadframe may include plating containing an adhesion sublayer and a wettable/protective sublayer. In other embodiments, the leadframe optionally comprises one or more surfaces that are roughened or burred by plating and/or another method to increase the locking between the molding compound and the die-attach epoxy and/or to increase the locking between the leads and a printed circuit board (PCB). In still other embodiments, the leadframe is optionally electroplated or otherwise coated with a layer of a solderable conductive material, such as tin, gold, lead, silver, and/or another solderable material.

Figure 2A:
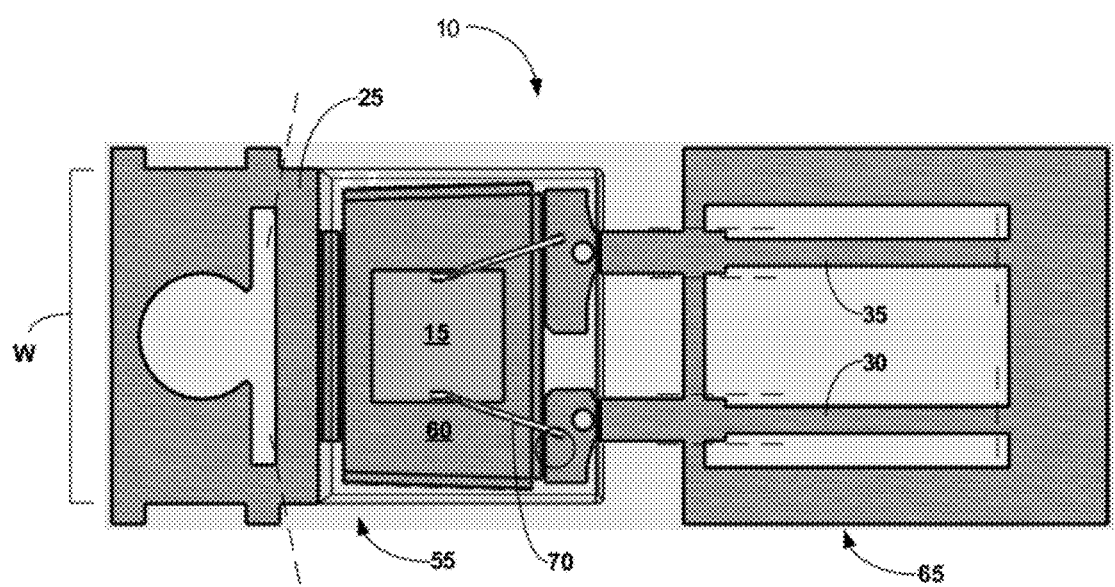
FIG. 2A shows a top view of some embodiments of a leadframe and a die used with the high-voltage packaged device.
Figure 2B:
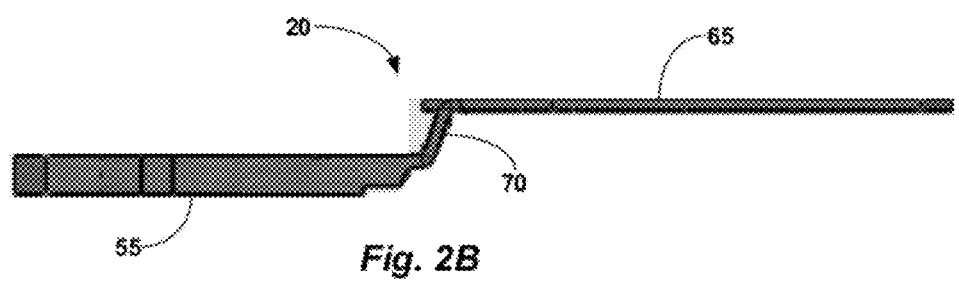
FIG. 2B shows a side view of some embodiments of the leadframe for use with the high-voltage packaged device.

The leadframe 20 can also comprise any component known in the art. For instance, the leadframe can comprise any suitable number of leadframe sections. By way of non-limiting illustration, FIGS. 2A and 2B show some embodiments in which the leadframe 20 comprise a first leadframe section 55 comprising the first lead 25 and a die attach pad 60, and a second leadframe section 65 comprising the second 30 and third 35 leads. While FIG. 2A shows the first 25, second 30, and third 35 leads attached to additional leadframe material, the skilled artisan will recognize that the excess material can be removed in any suitable manner (e.g., through stamping, cutting, etching, etc.) and at any suitable location, including, without limitation, at the dashed lines.

The first lead 25 can have any configuration that allows it to be externally exposed from the first end 45 of the molded housing 40 and to otherwise function as a lead for the package. In one example, FIGS. 2A (and 1B) shows some embodiments in which the first lead 25 (which may also be called a tab or a bonding pad) extends substantially across the width W of the packaged device 10. In another example, the first lead optionally comprises a mounting hole and/or an extended metal tab for high power dissipation.

In still another example, the first lead 25 can be electrically coupled to any suitable region of the circuit component (e.g., die 15). For instance, where the circuit component comprises a die having a BJT or a MOSFET, the first lead can respectively be electrically coupled to the collector region or the drain region of the die in any manner known in the art, including through the use of solder and/or wire bonding. Similarly, where the circuit component comprises an SCR or a triac, the first lead can be electrically coupled to an anode region of the SCR or the triac. Moreover, where the circuit component comprises one or more resistors, rectifiers, diodes, transistors, SCRs, triacs, and/or other electrical devices in a circuit or network, the first lead can be electrically coupled to an appropriate node of the circuit or network.

The second 30 and third 35 leads can have any configuration that allows them to be externally exposed at the second end 50 of the housing 40 and to otherwise allow them to function as leads. In one configuration, FIG. 2A shows some embodiments in which the second 30 and third 35 leads comprise elongated strips. In another configuration, FIG. 1B shows the second 30 and third 35 leads can be bent to contact a printed circuit board (PCB) or another suitable substrate.

In still another configuration, the second 30 and third 35 leads can be coupled to the circuit component (e.g., the die 15). For example, where the circuit component comprises a die having a BJT, the second and third leads can each be electrically coupled to a different region of the die so that one lead is coupled to the base region, while the other lead is coupled to the emitter region. Similarly, where the circuit component comprises a die having a MOSFET, the second and third leads can each be electrically coupled so that one lead is coupled to the die's gate region while the other lead is coupled to the source region. Additionally, where the circuit component comprises a resistor, a TVS, or another suitable component, one lead of the circuit component could be connected to the second 30 and third 35 leads and the other component lead could be connected to the packaged device's first lead 25. Additionally, where the circuit component comprises an SCR or a triac, the second lead can be electrically coupled to a gate region of the SCR or triac, and the third lead can be electrically coupled to a cathode region of the SCR or triac. Furthermore, where the circuit component comprises one or more resistors, rectifiers, diodes, transistors, SCRs, triacs, and/or other devices in a circuit or a network, the second lead and third lead can each be electrically coupled to an appropriate node of the circuit or network.

The second 30 and third 35 leads can be electrically coupled to the circuit component (e.g., die 15) in any manner known in the art, including, through the use of solder and/or wire bonding. For example, FIG. 2A shows some embodiments in which the second 30 and third 35 leads are electrically coupled to the die 15 through the use of bond wires 70.

With respect to the molded housing 40, it can be configured so that it surrounds the circuit component (e.g., die 15) while leaving a portion of the first 25, second 30, and third 35 leads externally exposed. The molded housing can comprise any suitable encapsulation material, including an epoxy molding compound, a thermoset resin, a thermoplastic material, a potting material, or combinations thereof. In some embodiments, however, the molded housing comprises an epoxy molding compound. The molded housing 40 can be formed in any manner known in the art, including through a transfer molding process, a film assisted molding process, and/or a compression molding process.

Figure 3:
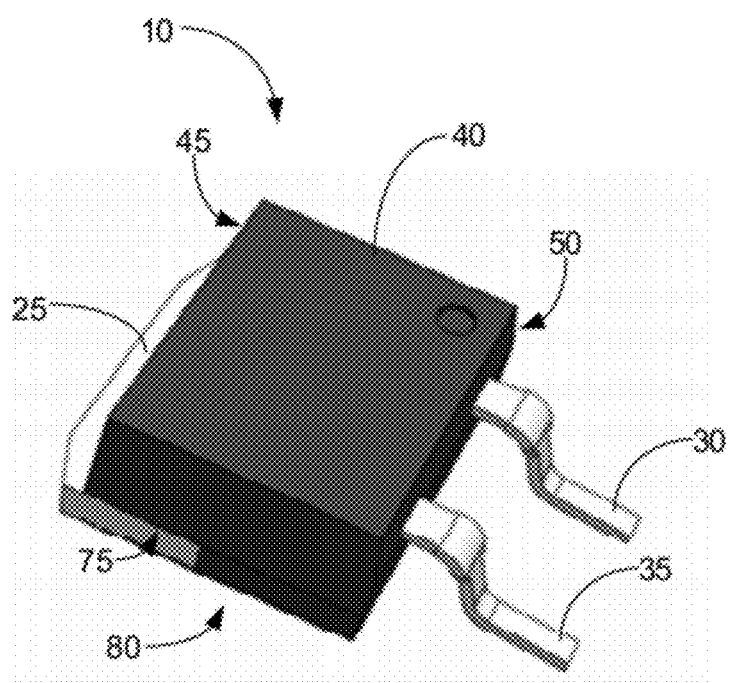
FIG. 3 shows a perspective view of some embodiments of the high-voltage packaged device comprising a recess in the molded housing that exposes a portion of a first lead from a lateral side of the housing.

The packaged device 10 can be modified in other embodiments. FIG. 3 shows some embodiments in which the molded housing 40 optionally defines a recessed portion 75 that allows a portion of the first lead 25 to be inset in the device 10 so that the first lead 25 is externally exposed on a lateral side 80 of the device 10. The amount of the first lead that is exposed from a lateral side of the device can be varied any suitable amount and for any suitable reason. For instance, the amount of the first lead that is exposed on a lateral side of the packaged device can be modified to increase and/or decrease the creepage distance between the first lead 25 and the second 30 and third 35 leads without requiring significant changes to the device's footprint. Additionally, the amount of the first lead that is exposed from a lateral side of the device may be varied to increase or decrease the size of a solder fillet that is used to couple the packaged device to a PCB or other substrate. Similarly, the amount of the first lead that is exposed from a lateral side of the packaged device can be modified to accommodate a number of different manufacturing processes and industry standards (i.e., the JEDEC standards for D2PAK devices). For example, the amount of the first lead that is exposed from the lateral edge of the device can be modified to allow for a bend in the first lead from the body of the device to the PCB.

As discussed above, while the packaged device 10 comprises a first lead 25 that is externally exposed from the first end 45 of a molded housing 40 and a second 30 and third 35 lead that are exposed from the second end 50 of the housing, the device does not include an additional (or fourth) lead that is electrically coupled to the first lead and that is externally exposed from the housing's second end. Thus, the packaged device can have any configuration that allows it to not have two leads that are externally exposed while being electrically coupled to the same internal connection.

Figure 4:
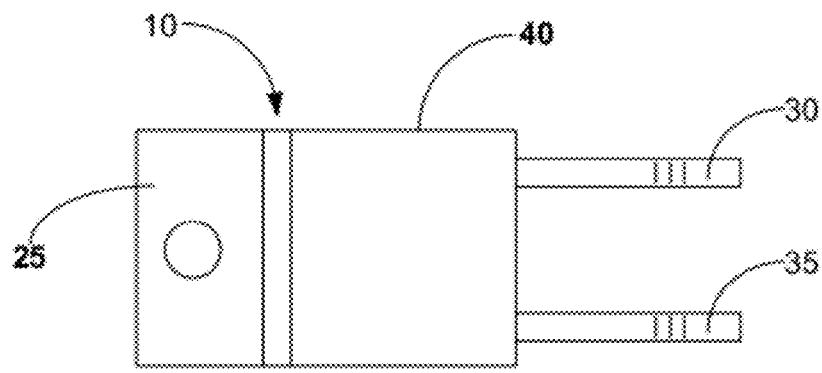
FIG. 4 shows a top view of some embodiments of the high-voltage packaged device, which lack a center lead that is electrically coupled to the first lead.

In one example of such a configuration, FIG. 4 shows some embodiments in which the packaged device 10 has three leads consisting of the first lead 25, the second lead 30, and the third lead 35. In these embodiments, the packaged device does not contain any conductive elements that are disposed between the second and third leads. That said, in some embodiments, the second 30 and third 35 leads may be connected to the same point internally for any reason, including to allow the packaged device to handle higher currents and/or to meet any other suitable electrical requirements. In any case, the area between the second and third leads is typically filled with an insulating material (e.g., molding) that has a substantially uniform conductivity level. Thus, by not having any lead or other conductive material placed between the second and third leads, the packaged device may have relatively long voltage creepage and voltage clearance distances.

In some embodiments of the packaged device 10, the creepage and clearance between the second 30 and third 35 leads is such that a high voltage can exist between the second and third leads, apart from the high voltage between the first lead 25 and the two other leads.

Figure 5:
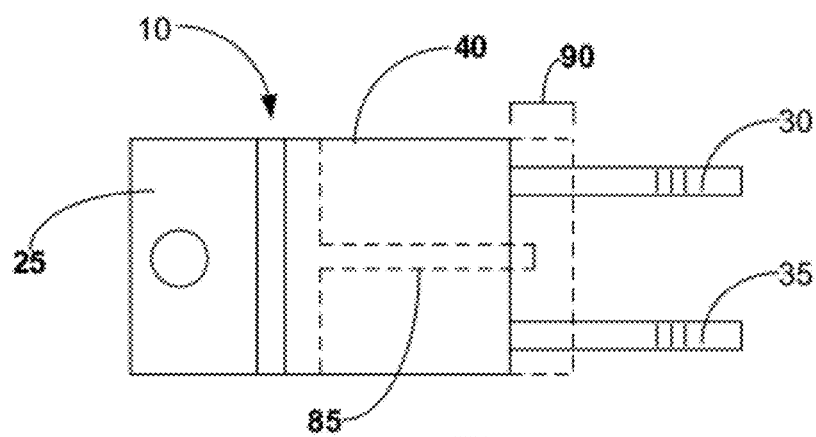
FIG. 5 shows a top view of some embodiments of the high-voltage packaged device in which the device comprises a center lead that is not externally exposed from the molded housing.

In another example of a configuration of the packaged device 10, FIG. 5 shows some embodiments in which the packaged device 10 comprises an additional lead or a center lead 85 that is electrically coupled to the first lead 25. FIG. 5 shows that in such embodiments, the molded housing 40 is extended (as shown by the dashed line section 90) to completely encapsulate the center lead 85. In this manner, the packaged device may comprise a center lead, which may be useful for holding the device during assembly, while having a greater voltage creepage and/or clearance distance than it would if the device comprised an externally exposed center lead that is electrically coupled to the first lead.

Figure 6:
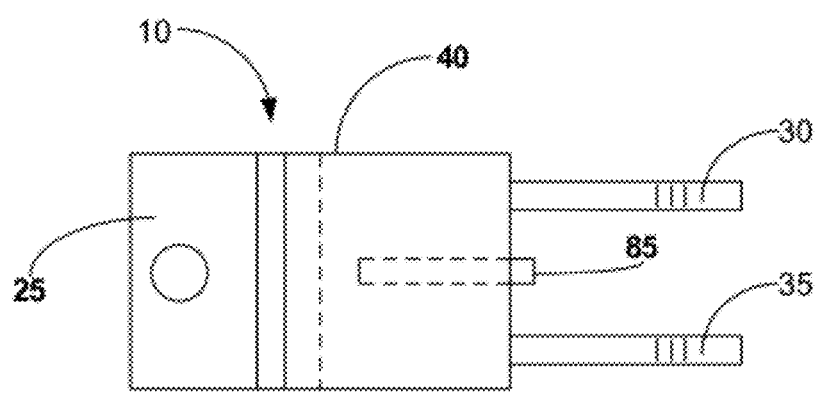
FIG. 6 shows a top view of some embodiments of the high-voltage packaged device in which the device comprises a center lead that is exposed from the molded housing but is electrically insulated from the first lead.

FIG. 6 shows another example of a configuration where the packaged device 10 has a center lead 85 that is externally exposed but is not electrically coupled to the first lead 25. In these embodiments, the device 10 comprises a center lead 85 that is cut away from or is otherwise electrically isolated from the first lead 25. In this manner, the device can comprise a center lead while still ensuring that the voltage creepage and clearance distance between the first lead and the second and third leads is sufficient in size to allow the packaged device to function at the desired operating voltages. In such embodiments, where the center lead is retained, but not connected to the first lead 25, the center lead can be used for any suitable purpose, including as a connection point for a four-lead circuit (e.g., a SCS (silicon controlled switch), a PUT (programmable uni-junction transistor), an ESBC (emitter switched BJT/MOSFET cascade)), or an IC that might use the molded housing to encapsulate a more complicated function or device.

The voltage creepage and/or clearance distance between the first lead 25 and the second 30 or third 35 leads can be any suitable distance that allows the packaged device 10 to function as intended. In some embodiments, the minimum voltage creepage distance on the device can range from about 2 mm to about 5 mm. In other embodiments, the minimum voltage creepage distance on the device can range from about 5 mm to about 8 mm. In yet other embodiments, the minimum voltage creepage distance between the first lead and the second or third lead can be about 6.3 mm or about 6.35 mm. In still other embodiments, the minimum voltage creepage distance can be modified for a variety of factors, including, the operating voltage, the humidity in which the packaged device will be used, safety regulations, etc.

The packaged device 10 can function at any suitable operating voltage. In some embodiments, the packaged device can operate at a voltage ranging from less than about 0.1 volt to more than about 2.5 KV. Indeed, in some embodiments, the packaged device can operate at a voltage as high as a voltage selected from about 1.8 KV, about 2 KV, about 2.5 KV, and about 2.8 KV. In some embodiments, the packaged device can also operate at a voltage as low as a voltage selected from about 0.1 V, about 0.5 KV, about 1.8 KV, and about 2 KV. In some embodiments, however, in which the packaged device is used in a switching device, the packaged device may be able to withstand around 0.1 Vs when the circuit component (e.g., a BJT on Die 15) is conducting, and as much as about 2.5 KV when the packaged device is turned off. In still other embodiments, however, the packaged device is able to operate between about 1.8 KV and about 2.5 KV.

Figure 7:
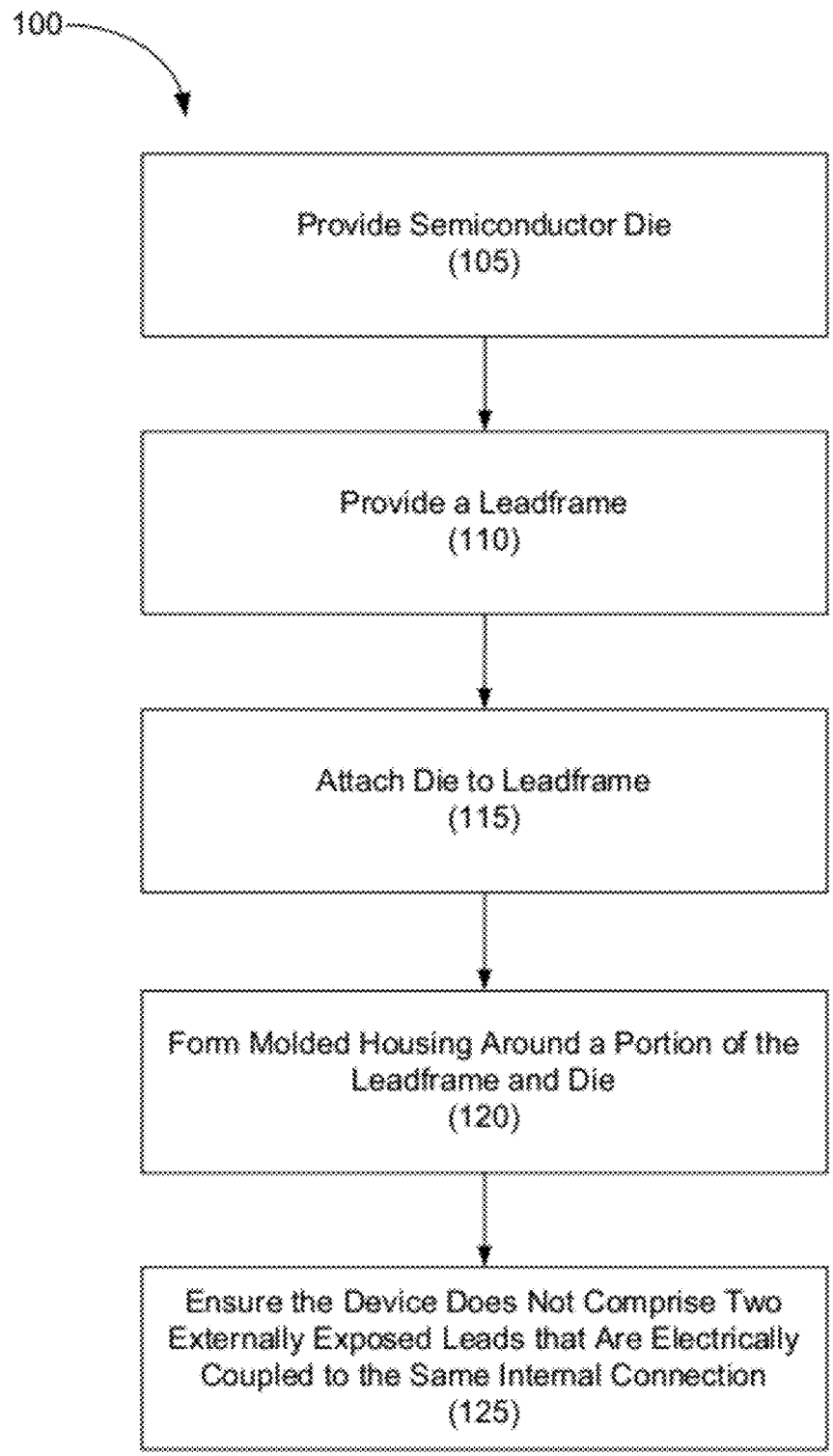
FIG. 7 shows some embodiments of methods for making a high-voltage packaged device.

The packaged devices 10 described herein can be made in any manner which forms the structures described. FIG. 7 shows some embodiments of methods for making the packaged device 10. While FIG. 7 shows a particular method 100, that method can be rearranged, added to, shortened, or otherwise modified in any suitable manner that allows the described packaged device to be produced.

The method 100 shown in FIG. 7 begins at box 105 where the method can be begin by providing one or more circuit components (e.g., die 15), which generally have bond pads. Box 110 shows that the method continues by providing a leadframe 20. Next, box 115 shows that the circuit component (e.g., die 15) and leadframe can be attached to each other through any suitable known technique. Once the circuit components (e.g., die 15) are attached to the leadframe 20, box 120 shows that the method 100 continues when a portion of the circuit components and the leadframe are encapsulated in the molded housing 40.

Finally, box 125 shows the method 100 does not include forming a fourth lead that is both electrically connected to the first lead and that is exposed from the second end of the molded housing. That said, in embodiments that are not illustrated, the packaged device's external pins may include two or more externally exposed leads (e.g., the second lead 30, the third lead 35, and/or the center lead 85) that are electrically coupled to the same internal connection (e.g., connecting to a high power component, such as a rectifier, and isolated from the first lead). In such embodiments, the second 30, third 30, and/or center 85 leads may be shorted internally within the housing.

The portion of the method depicted by box 125 can be performed in any known manner, including the following three processes. First, not forming a lead disposed between the second 30 and third 35 leads. Second, completely encapsulating any lead (e.g., a center lead 85) that is electrically coupled to the first lead 25 and that is at least partially disposed between the second and third leads. And third, insulating the first lead from any other lead (or conductive material) that is disposed between the second and third leads.

The packaged devices 10 described herein exhibit several features. First, the described packaged device may have longer voltage creepage and/or clearance distances than certain conventional D2PAK device. For example, unlike the D2PAK device 130 in FIG. 8A, which comprises a short center lead 135 that is electrically coupled to the D2PAK's first lead 140 and that is externally exposed between the D2PAK's second 145 and third 150 leads, the packaged device 10 in FIG. 8B has a longer voltage creepage and clearance distance between its first lead 25 (or any possible lead connected to the first lead) and its second 30 and third 35 leads.

Figure 9:
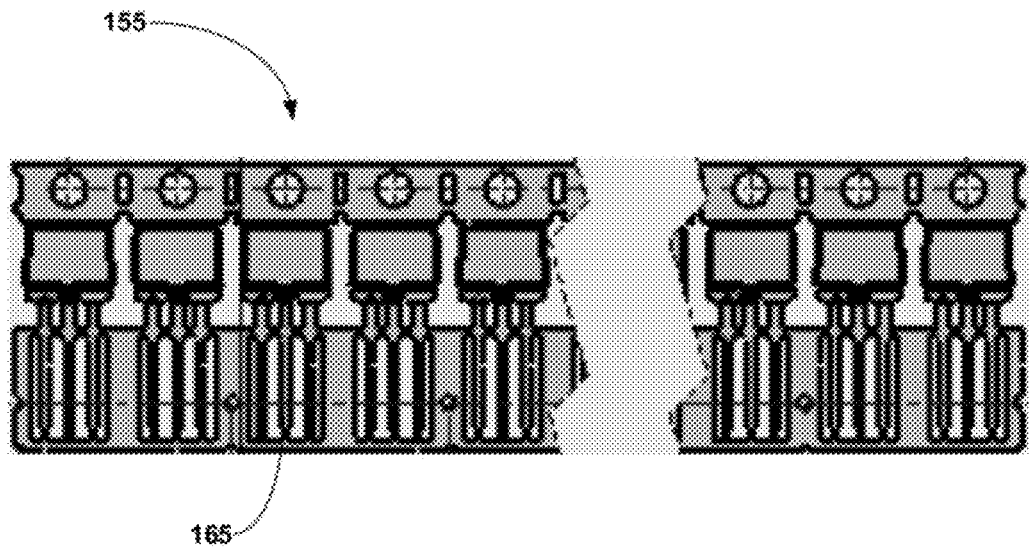
FIG. 9 shows a top view of a prior art leadframe strip.
Figure 10:
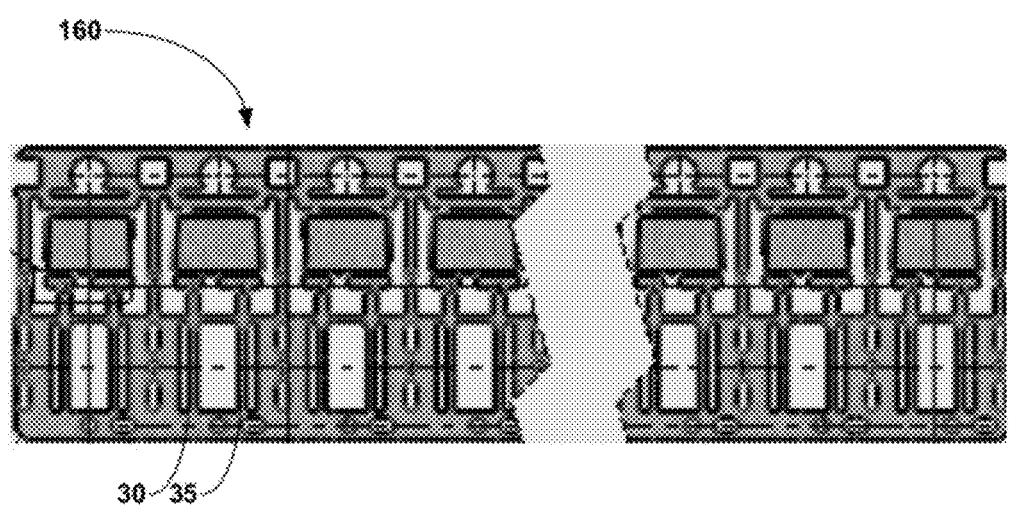
FIG. 10 shows a top view of some embodiments of a leadframe strip that are used with the high-voltage packaged device.

Second, unlike the prior art leadframe strips 155 shown in FIG. 9, the leadframe strips 160 shown in FIG. 10 that are used in some embodiments of the packaged device 10 need not comprise a center lead (shown as 165 in FIG. 9) between the second 30 and third 35 leads. Accordingly, the packaged devices described herein may have a higher voltage breakdown point than some conventional D2PAK and DPAK devices. For instance, while the minimum lead spacing on some prior art D2PAKs and TO-220 devices may be as little as about 1.52 mm, the minimum lead spacing on some embodiments of the described packaged device may much greater, as described above. Thus, where some conventional D2PAK and TO-220 packages may operate up to around 800 V, some embodiments of the described packaged devices are capable of operating at much higher voltages, as described above.

Figure 8A:
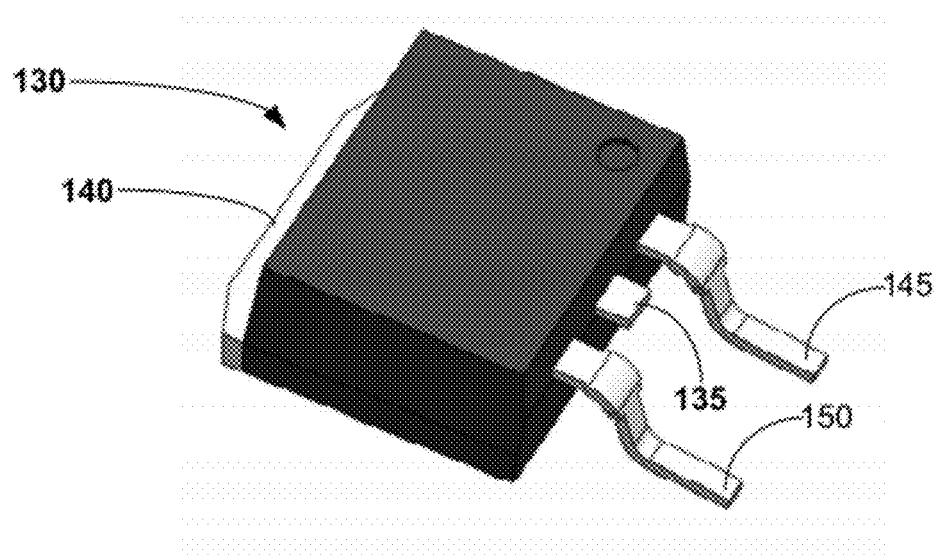
FIG. 8A shows a perspective view of a prior art D2PAK device.
Figure 8B:
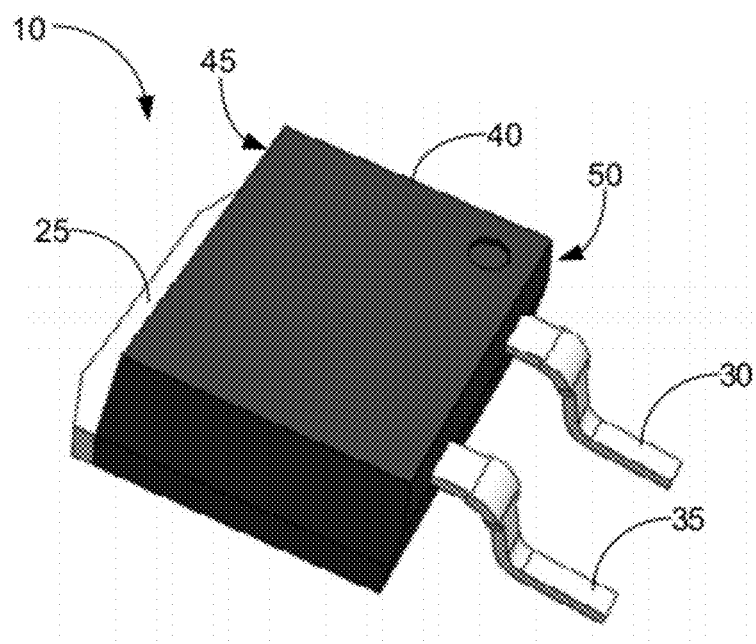
FIG. 8B shows a perspective view of some embodiments of the high-voltage packaged device.

As a side note, the center lead 135 in FIG. 8A may be useful for a variety of reasons. For example, the center lead 135 may be useful to provide support to the first lead 140 during assembly of the device 130. In another example, the center lead 135 may provide an electrical connection to the first lead 140 where the device 130 is mounted to a heatsink with thermal paste (electrically non-conductive) or when the user does not solder the first lead 135 to the PCB but instead bolts it down to the PCB. In contrast, because some embodiments of the described packaged devices do not comprise such a center lead, such embodiments may not have such features.

A third feature of the packaged devices described herein is that they are capable of being produced with essentially the same handling and package placement equipment that can be used to manufacture conventional D2PAK and DPAK devices. A fourth feature of the packaged devices described herein is a footprint that is similar to that of a conventional D2PAK or DPAK device. Accordingly, the described packaged devices can be used on a PCB in place of a conventional D2PAK or DPAK device without substantially modifying the PCB. In this regard, the packaged device can comprise a modified D2PAK or DPAK device.

A fifth feature of packaged devices described herein is that they can automatically be surface mounted. A sixth feature is that because the described packaged devices can operate at relatively high voltages, they can be used in some high-voltage applications (such as in smart meters, smart breakers, windmills, solar power generation systems, power supplies, ballasts, etc.) in which certain conventional D2PAK and DPAK devices have an insufficient voltage breakdown.

In some embodiments, this application relates to a method for forming a packaged device, comprising: providing a circuit component; providing a leadframe comprising three leads; attaching the circuit component to the leadframe; forming a molded housing around at least a portion of the circuit component and the leadframe so that the first lead is exposed from a first end of the molded housing and the second lead and the third lead are exposed from a second end of the molded housing, wherein the second end is disposed opposite to the first end without forming a fourth lead that is both electrically coupled to the first lead and that is exposed from the second end of the molded housing. In this method, the circuit component may comprise a transistor. In this method, the transistor comprises a MOSFET, and wherein the first lead is electrically coupled to a drain region of the MOSFET, the second lead is electrically coupled to a gate region of the MOSFET, and the third lead is electrically coupled to a source region of the MOSFET. In this method, the transistor comprises a BJT, and wherein the first lead is electrically coupled to a collector region of the BJT, the second lead is electrically coupled to a base region of the BJT, and the third lead is electrically coupled to emitter region of the BJT. In this method, the circuit component comprises a SCR or triac, and the first lead is electrically coupled to an anode region of the SCR or Triac, the second lead is electrically coupled to a gate region of the SCR or Triac, and the third lead is electrically coupled to a cathode region of the SCR or Triac. In this method, the circuit component comprises a device selected from a resistor, a rectifier, a diode, a transistor, an SCR, and a triac, in a circuit or a network, and wherein the first lead is electrically coupled to an electrically appropriate node of the circuit or network, the second lead is electrically coupled to an electrically appropriate node of the circuit or network, and the third lead is electrically coupled to an electrically appropriate node of the circuit or network. This method further comprises forming the leadframe with a center lead that is electrically coupled to the first lead and that is disposed between the second lead and the third lead, and encapsulating the center lead so it is not exposed from the molded housing's second end. This method further comprises including a center lead that is electrically isolated from the first lead between the second lead and the third lead, and exposing the center lead from the second end of the molded housing. This method further comprises placing a molding material between second lead and the third lead so that an area extending from the second lead to the third lead is substantially uniform in conductivity.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

The invention claimed is:

1. A DPAK or D2PAK semiconductor packaged device operating with a high voltage capability above 1.8 KV, comprising:
   a circuit component;
   a molded housing encapsulating at least a portion of the circuit component, wherein the housing comprises a first end and a second end;
   a first lead extending from the first end of the molded housing; and
   a second lead and a third lead extending from the second end of the molded housing,
   wherein the packaged device does not comprise a fourth lead that is both electrically connected to the first lead and that extends from the second end of the molded housing.

2. The packaged device of claim 1, wherein the molded housing defines a recess that exposes a portion of the first lead from a lateral side of molded housing.

3. The packaged device of claim 1, further comprising a center lead that is electrically coupled to the first lead and is encapsulated in the molded housing so as to not be exposed from the housing.

4. The packaged device of claim 1, further comprising a center lead that is not electrically coupled to the first lead and that is exposed from molded housing's second end.

5. The packaged device of claim 1, wherein an area that extends from the second lead to the third lead consists of a nonconductive material.

6. The packaged device of claim 1, wherein the circuit component comprises a part selected from transistor, a triac, a diac, a resistor, a diode, an SCR, an SCS, and a rectifier.

7. The packaged device of claim 1, wherein the circuit component comprises a transistor having a MOSFET.

8. The packaged device of claim 1, wherein the circuit component comprises a transistor having a BJT.

9. The packaged device of claim 6, wherein the molded housing comprises a recess that exposes a portion of the first lead from a lateral side of molded housing.

10. The packaged device of claim 1, wherein the semiconductor device functions at voltages above about 1.8 KV without experiencing voltage breakdown.

11. The packaged device of claim 1, wherein the circuit component comprises a network of electrical devices or an integrated circuit.

12. A DPAK or D2PAK semiconductor packaged device operating with a high voltage capability above 1.8 KV, comprising:
   a semiconductor die having a transistor;
   a molded housing encapsulating at least a portion of the semiconductor die, wherein the housing comprises a first end and a second end;
   a first lead extending from the first end of the molded housing; and
   a second lead and a third lead extending from the second end of the molded housing,
   wherein an area that extends from the second lead to the third lead in the molded housing comprises an insulating material having a substantially uniform conductivity.

13. The packaged device of claim 12, wherein the molded housing comprises a recess that exposes a portion of the first lead from a lateral side of molded housing.

14. The packaged device of claim 12, wherein the semiconductor die comprises a transistor selected from a MOSFET and a BJT.

15. The packaged device of claim 12, wherein the semiconductor device functions at voltages up to about 2.5 KV without experiencing voltage breakdown.

16. An electronic apparatus, comprising:
   a circuit board; and
   a DPAK or D2PAK semiconductor packaged device connected to the circuit board, the packaged device operating with a high voltage capability above 1.8 KV and comprising:
      a circuit component;

a molded housing encapsulating at least a portion of the circuit component, wherein the housing comprises a first end and a second end;

a first lead extending from the first end of the molded housing; and a second lead and a third lead extending from the second end of the molded housing, wherein the semiconductor device does not comprise a fourth lead that is both electrically connected to the first lead and that is exposed from the second end of the molded housing.

17. The apparatus of claim 16, wherein an area that extends from the second lead to the third lead in the molded housing comprises an insulating material having a substantially uniform conductivity.

18. The apparatus of claim 16, wherein the molded housing comprises a recess that exposes a portion of the first lead from a lateral side of molded housing.

19. The apparatus of claim 16, wherein the circuit component comprises a semiconductor die having a transistor selected from a MOSFET and a BJT.

20. The apparatus of claim 16, wherein the packaged device functions at voltages up to about 2.5 KV without experiencing voltage breakdown.

21. The packaged device of claim 1, wherein the semiconductor package operates with a high voltage capability ranging from about 1.8 KV to about 2.5 KV.

22. The packaged device of claim 12, wherein the semiconductor package operates with a high voltage capability ranging from about 1.8 KV to about 2.5 KV.

23. The apparatus of claim 16, wherein the semiconductor package operates with a high voltage capability ranging from about 1.8 KV to about 2.5 KV.

24. The packaged device of claim 1, wherein the first lead extends beyond the first end of the molded housing and the second and third leads extend beyond the second end of the molded housing.

25. The packaged device of claim 12, wherein the first lead extends beyond the first end of the molded housing and the second and third leads extend beyond the second end of the molded housing.

26. The apparatus of claim 16, wherein the first lead extends beyond the first end of the molded housing and the second and third leads extend beyond the second end of the molded housing.

* * * * *